US012476655B2

(12) United States Patent
Ziesler

(10) Patent No.: US 12,476,655 B2
(45) Date of Patent: Nov. 18, 2025

(54) LOW-DENSITY PARITY CHECK DECODER

(71) Applicant: Cortina Access, Inc., San Jose, CA (US)

(72) Inventor: Sebastian Havluj Ziesler, San Jose, CA (US)

(73) Assignee: REALTEK SINGAPORE PRIVATE LIMITED, Singapore (SG)

( * ) Notice: Subject to any disclaimer, the term of this patent is extended or adjusted under 35 U.S.C. 154(b) by 84 days.

(21) Appl. No.: 18/664,711

(22) Filed: May 15, 2024

(65) Prior Publication Data

US 2025/0119162 A1  Apr. 10, 2025

Related U.S. Application Data

(60) Provisional application No. 63/542,311, filed on Oct. 4, 2023.

(51) Int. Cl.
*H03M 13/11* (2006.01)

(52) U.S. Cl.
CPC .... *H03M 13/1174* (2013.01); *H03M 13/1125* (2013.01); *H03M 13/118* (2013.01)

(58) Field of Classification Search
CPC ......... H03M 13/1174; H03M 13/1125; H03M 13/118; H03M 13/1137; H03M 13/116
See application file for complete search history.

(56) References Cited

U.S. PATENT DOCUMENTS

| 9,160,366 | B2 * | 10/2015 | Branco | H03M 13/6516 |
| 2007/0192670 | A1 * | 8/2007 | Ikeda | H03M 13/033 714/794 |
| 2010/0122143 | A1 * | 5/2010 | Lee | H03M 13/1117 714/752 |
| 2012/0297273 | A1 | 11/2012 | Sakaue et al. | |

(Continued)

FOREIGN PATENT DOCUMENTS

| CN | 112632911 A | 4/2021 |
| CN | 115425988 A | 12/2022 |
| WO | 2007126328 A1 | 11/2007 |

OTHER PUBLICATIONS

Fossorier, M.P.C., et al.; "Reduced Complexity Iterative Decoding of Low-Density Parity Check Codes Based on Belief Propagation;" IEEE Transactions on Communications; vol. 47; No. 5; May 1999; pp. 673-680.

*Primary Examiner* — Steve N Nguyen
(74) *Attorney, Agent, or Firm* — McClure, Qualey & Rodack, LLP

(57) ABSTRACT

An LDPC decoder includes a parity check code storage block and a plurality of computing engines. The parity check code storage block is configured to store a parity check code matrix. The parity check code matrix includes a plurality of columns. Each of the columns includes a plurality of sub-matrices. The parity check code storage block includes a plurality of column group storage blocks. Each of the column group storage blocks is configured to store a column group including one or more of the columns. The column (Continued)

B1

| | |
|---|---|
| B2 | G1:C1 |
| | G17:C55,C56 |
| | G19:C59,C60 |
| | G21:C63,C64 |
| | G23:C67,C68 |
| B2 | G8:C15,C40,C42 |
| | G13:C28,C39,C48 |
| | G3:C3,C12,C23,C49 |
| | G5:C6,C10,C11,C50 |
| | G7:C14,C20,C32,C34 |
| | G10:C18,C24,C33,C41 |
| B2 | G15:C44,C45,C46,C47 |
| | G12:C27,C36,C37,C38 |
| | G9:C16,C17,C19,C35 |
| | G6:C9,C13,C21,C22 |
| | G4:C4,C5,C7,C51 |
| | G14:C29,C30,C31 |
| | G11:C25,C26,C43 |
| B2 | G2:C2,C8,C52 |
| | G22:C65,C66 |
| | G20:C61,C62 |
| | G18:C57,C58 |
| | G16:C53,C54 |
| B2 | G0:C0 |

G{G0~G23    C{C0~C68 group storage block which stores the column group including one or more of the columns is disposed closer to the center of the parity check code storage block. The computing engines are disposed on two sides of the parity check code storage block.

16 Claims, 12 Drawing Sheets

(56) References Cited

U.S. PATENT DOCUMENTS

| | | | |
|---|---|---|---|
| 2013/0139038 A1* | 5/2013 | Yosoku | H03M 13/1131 714/780 |
| 2014/0223254 A1* | 8/2014 | Pisek | H03M 13/033 714/755 |
| 2016/0294415 A1 | 10/2016 | Sugihara et al. | |
| 2017/0019125 A1* | 1/2017 | Matsumoto | H03M 7/55 |
| 2020/0218607 A1 | 7/2020 | Ha et al. | |

* cited by examiner

FIG. 1A

|   | C0 | C1 | C2 | C3 | C4 | C5 | C6 | C7 | C8 | C9 | C10 | C11 | C12 | C13 | C14 | C15 | C16 | C17 | C18 | C19 | C20 | C21 | C22 |
|---|---|---|---|---|---|---|---|---|---|---|---|---|---|---|---|---|---|---|---|---|---|---|---|
| | 27 | 58 | 19 |  | 129 |  |  |  |  | 242 |  |  |  |  | 94 |  |  |  |  |  |  |  |  |
| | 42 | 0 |  |  |  | 228 | 0 | 48 | 0 |  | 171 | 0 |  |  |  | 246 |  | 2 |  | 165 |  | 0 | 77 |
| | 234 | 172 |  |  |  |  |  |  |  |  |  | 217 |  | 101 | 36 | 0 | 135 |  |  |  | 198 |  | 0 |
| | 228 | 39 |  |  | 140 |  |  | 10 |  | 109 |  | 0 | 251 |  |  | 4 |  |  | 136 |  |  |  |  |
| | 241 | 242 | 46 |  |  |  | 46 | 0 |  |  |  | 121 | 22 | 22 |  |  | 0 | 0 | 0 |  |  |  | 236 |
| | 94 | 193 |  | 5 |  |  | 43 | 140 |  |  | 159 |  |  | 0 | 0 |  |  |  |  |  | 0 |  |  |
| | 192 | 25 |  | 0 |  |  |  |  |  |  |  |  |  |  |  |  |  | 94 | 145 |  |  |  |  |
| | 0 | 120 |  | 58 |  | 153 |  |  | 212 | 3 |  | 194 |  |  |  |  |  |  |  |  |  | 193 |  |
| | 215 | 16 |  |  |  |  |  |  |  | 0 |  |  |  | 0 |  |  |  |  |  |  | 203 |  |  |
| | 109 | 202 |  |  | 0 |  |  |  |  |  |  |  |  | 22 |  | 91 |  | 94 |  |  |  |  |  |
| | 88 | 207 |  |  |  |  |  |  |  |  |  |  |  |  |  |  |  |  |  |  |  |  |  |
| |  | 69 |  |  |  |  |  |  |  |  |  |  |  |  |  |  |  |  |  |  |  |  |  |

| | C23 | C24 | C25 | C26 | C27 | C28 | C29 | C30 | C31 | C32 | C33 | C34 | C35 | C36 | C37 | C38 | C39 | C40 | C41 | C42 | C43 | C44 | C45 |
|---|---|---|---|---|---|---|---|---|---|---|---|---|---|---|---|---|---|---|---|---|---|---|---|
| M2 | 85 | | | 255 | | 247 | | | | | | 211 | | | | 126 | | | 19 | | | 105 | |
| M2 | | 219 | | | 19 | | 19 | 17 | 108 | | | | 60 | 0 | | | 252 | | 0 | | 169 | 0 | 98 |
| | | 0 | | | | 76 | | | 23 | 0 | | | 0 | 129 | 96 | 225 | | 214 | | 142 | | 16 | 192 |
| M2 | | 235 | | | | | | 100 | 172 | | | 51 | | | | | | | 61 | | 128 | | |
| | | | 219 | | | | | | | 112 | | 0 | | 196 | | | | | | 0 | | | |
| | | | | | | | | 0 | 0 | | 29 | | | | 0 | | | | | 129 | | | 0 |
| M2 | 0 | | 163 | 39 | 139 | 0 | | | | | | | 222 | | 41 | | 157 | 0 | | | | | |
| M2 | | | | | 0 | | 145 | | | | 175 | | | | | | 0 | 162 | | | | | |
| M2 | 36 | | | | | | | | | | | | | | | | | | | | | | |

FIG. 1C

| | C46 | C47 | C48 | C49 | C50 | C51 | C52 | C53 | C54 | C55 | C56 | C57 | C58 | C59 | C60 | C61 | C62 | C63 | C64 | C65 | C66 | C67 | C68 |
|---|---|---|---|---|---|---|---|---|---|---|---|---|---|---|---|---|---|---|---|---|---|---|---|
| | | | | | 178 | | | 218 | | 59 | | 222 | | | 143 | | 11 | | 169 | 60 | | | 80 |
| M2→ | | 232 | 217 | 0 | 0 | 255 | 183 | 0 | 239 | 0 | 178 | 0 | 136 | 0 | | | 202 | 0 | | 0 | | 0 | |
| | | | 0 | | | | 77 | | 221 | | 227 | | 201 | | | | | 237 | | 74 | 250 | 91 | 105 |
| | | | 13 | 221 | | | 95 | 1 | | 147 | | 80 | 180 | | 165 | | | 43 | | 87 | | | |
| | | | | | | | | 177 | 70 | | 144 | 92 | 135 | | | 139 | | 195 | 238 | | 104 | 170 | 137 |
| M2→ | | | 62 | | 123 | 44 | 0 | | 48 | 191 | | 177 | | 65 | 225 | 150 | | 49 | 93 | 37 | 15 | 46 | |
| | | | | | | | 252 | 177 | 0 | | 0 | 16 | 247 | | 228 | | | | | | | 118 | |
| | 192 | 0 | | | | | | | 97 | 251 | 243 | | 0 | 78 | 228 | | 0 | | 0 | | 0 | 208 | 0 |
| | | 104 | | | | | 49 | 201 | | | 134 | | 217 | | | 191 | 191 | 41 | 39 | 123 | | | 209 |
| M2→ | | | | | | | | 238 | | 130 | | | 37 | | 211 | 159 | | | | | 252 | | |
| | 144 | | | | | | | | | | | | 130 | | 69 | 57 | 150 | | 216 | | 93 | | 53 |
| | | | | | | | | | | | | | | | 9 | | | | | | | | |

| G0 | G1 | G2 | G3 | G4 | G5 | G6 | G7 | G8 | G9 | G10 | G11 | G12 | G13 | G14 | G15 | G16 | G17 | G18 | G19 | G20 | G21 | G22 | G23 |
|---|---|---|---|---|---|---|---|---|---|---|---|---|---|---|---|---|---|---|---|---|---|---|---|
| 27 | 58 | 19 | 85 | 129 | 178 | 242 | 211 | 94 | 246 | 19 | 255 | 126 | 247 |  | 105 | 218 | 59 | 222 | 143 | 11 | 169 | 60 | 80 |
|  | 0 | 0 | 0 | 0 | 0 | 0 | 0 |  | 0 | 0 | 0 | 0 | 0 | 0 | 0 | 0 | 0 | 0 | 0 | 0 | 0 | 0 | 0 |
| 42 | 172 | 183 | 217 | 48 | 217 | 77 | 101 |  | 60 | 2 | 169 | 129 | 76 | 19 | 232 | 239 | 178 | 136 | 201 | 202 | 237 | 74 | 91 |
| 234 | 39 | 77 | 0 | 228 | 171 | 198 | 165 | 36 | 0 | 219 |  | 96 | 252 | 17 | 16 | 221 | 227 | 80 | 180 | 165 | 43 | 87 | 105 |
| 228 | 242 | 46 | 121 | 0 | 0 | 0 | 23 | 142 | 135 | 0 | 225 |  | 13 | 108 | 98 | 1 | 147 | 92 | 135 | 139 | 195 | 250 | 170 |
| 241 | 193 | 95 | 221 | 140 | 0 | 251 | 51 | 214 | 4 | 235 | 19 |  |  | 100 | 192 | 70 | 144 | 177 | 65 | 150 | 49 | 37 | 46 |
| 94 | 25 | 10 | 5 | 255 | 109 | 236 | 0 | 0 | 136 | 61 | 196 |  |  | 172 | 177 | 191 | 247 |  | 225 | 228 | 238 | 104 | 137 |
| 192 | 120 | 0 | 0 | 0 | 159 | 22 | 112 | 0 | 0 | 0 | 0 | 62 | 0 | 0 | 0 | 48 | 0 | 16 | 78 | 228 | 93 | 15 | 118 |
| 0 | 16 | 0 | 44 | 0 | 0 | 0 | 0 | 0 | 0 | 163 | 0 | 0 | 0 | 0 | 0 | 0 | 251 | 0 | 0 | 0 | 0 | 0 | 208 |
| 215 | 202 | 252 | 58 | 140 | 46 | 193 | 0 | 129 | 145 | 29 | 41 | 41 |  | 0 | 0 | 97 | 243 | 217 | 211 | 191 | 41 | 123 | 0 |
| 109 | 207 | 49 | 194 | 153 | 43 | 3 | 203 | 222 | 94 | 39 | 139 | 139 | 157 |  | 104 | 201 | 134 | 37 | 69 | 159 | 39 | 252 | 209 |
| 88 | 69 | 212 | 36 | 0 | 0 | 0 | 22 | 162 | 91 | 175 |  | 0 | 0 | 145 | 144 | 238 | 130 | 130 | 9 | 57 | 216 | 93 | 53 |

LOW-DENSITY PARITY CHECK DECODER

CROSS-REFERENCE TO RELATED APPLICATION

This non-provisional application claims priority under 35 U.S.C. § 119(e) to U.S. Provisional Application 63/542,311 filed on Oct. 4, 2023, the entire contents of which are hereby incorporated by reference.

BACKGROUND OF THE INVENTION

Technical Field

The present invention relates to a low-density parity check decoder which reduces clock speed and/or power consumption.

Related Art

Low density parity check (LDPC) codes are widely used as error correction codes for passive optical networks (PON), Ethernet and other data communication protocols because the error correction capabilities of LDPC codes are very close to the theoretical maximum (i.e., Shannon Limit). A common algorithm used to perform decoding and error correction of LDPC codes is the log-likelihood ratio (LLR) minimum-sum algorithm.

A common hardware implementation for performing decoding and error correction of LDPC codes involves utilizing minimum-sum computing engines to perform LLR minimum sum computations on the LDPC codes. However, if only a single minimum-sum computing engine is used to perform computations on LDPC codes, the clock speed of the circuit to achieve decoding needs to be very fast. Taking a 25G PON as an example, the LDPC codes of the 25G PON is a 17664×3072 sparse matrix composed of a 69×12 array of 256×256 submatrices. To compute LDPC codes for the 25G PON using a single minimum-sum computing engine, the circuit to achieve decoding would require a very fast clock speed of around 50 GHz, which is not achievable with current or foreseeable integrated circuit technologies.

Therefore, in practice, decoding computations are implemented through multiple parallel minimum-sum computing engines. In theory, the 25G PON could employ 256 parallel minimum-sum computing engines. However, using 256 engines would result in an excessive number of signals in the circuit. When computer-aided design (CAD) tools for placement and routing discover an overwhelming number of signals in the circuit, the tools may struggle to perform placement and routing. Therefore, for the 25G PON, the practical upper limit for the number of the parallel minimum-sum computing engines is 64. However, even when utilizing 64 minimum-sum computing engines, the required clock speed for the circuit to achieve decoding still approaches 1 GHz. Consequently, the circuit to achieve decoding remains challenging to be implemented and consumes a great amount of power.

SUMMARY OF THE INVENTION

In some embodiments, an LDPC decoder comprises a parity check code storage block and a plurality of computing engines. The parity check code storage block is configured to store a parity check code matrix The parity check code matrix comprises a plurality of columns. Each of the columns comprises a plurality of submatrices. The parity check code storage block comprises a plurality of column group storage blocks. Each of the column group storage blocks is configured to store a column group comprising at least one of the columns. The column group storage block which stores the column group comprising more of the columns is disposed closer to the center of the parity check code storage block. The computing engines are coupled to the parity check code storage block. The computing engines are configured to perform LLR minimum sum computations on the parity check code matrix. The computing engines are disposed on two sides of the parity check code storage block.

In some embodiments, the computing engines are disposed in a checkerboard arrangement on the two sides of the parity check code storage block.

In some embodiments, the computing engine which is further away from the parity check code storage block has a faster computing speed.

In some embodiments, a buffer zone is disposed between some of two adjacent computing engines of the computing engines. The buffer zone comprises one or more buffer units.

In some embodiments, the buffer zone which is further away from the parity check code storage block comprises more of the buffer units and has a greater buffering capacity.

In some embodiments, the number of the computing engines disposed on one of the two sides of the parity check code storage block and the number of the computing engines disposed on the other side of the parity check code storage block are the same.

In some embodiments, the LDPC decoder is a 25G passive optical network (PON) decoder.

In some embodiments, the number of the computing engines is 256. The number of the computing engines disposed on the one side of the parity check code storage block and the number of the computing engines disposed on the other side of the parity check code storage block are both 128.

In some embodiments, the computing engines are disposed in a 16×8 checkerboard arrangement on the two sides of the parity check code storage block.

In some embodiments, each of the column group storage blocks comprises 6 precision bits.

In some embodiments, the 6 precision bits comprise 1 sign bit and 5 value bits.

In some embodiments, the number of the column group storage blocks is 24.

In some embodiments, the number of the columns comprised in each of the column groups ranges from 1 to 4.

In some embodiments, each of the columns is assigned to only one of the column group.

In some embodiments, each of the columns comprises a plurality of rows. Each of the submatrices is located in a corresponding one of the rows. Each of the submatrices is a zero matrix or a shifted identity matrix. The zero matrices located in the same row of all of the columns in each of the column groups are merged.

In some embodiments, the computing engines are symmetrically disposed on the two sides of the parity check code storage block.

To sum up, according to one or some embodiments, the CAD tools are able to place and route the LDPC decoder which comprises up to 256 parallel computing engines, so that the LDPC decoder can have the slowest possible clock speed while still meeting the target decoding throughput.

The following will describe the detailed features and advantages of the instant disclosure in detail in the detailed description. The content of the description is sufficient for any person skilled in the art to comprehend the technical context of the instant disclosure and to implement it accordingly. According to the content, claims and drawings disclosed in the instant specification, any person skilled in the art can readily understand the goals and advantages of the instant disclosure.

BRIEF DESCRIPTION OF THE DRAWINGS

The disclosure will become more fully understood from the detailed description given herein below for illustration only, and thus not limitative of the disclosure, wherein:

FIG. 1A to FIG. 1C illustrate schematic views of an embodiment of a parity check code matrix.

FIG. 2 illustrates a schematic view of an embodiment of a plurality of column groups.

FIG. 3 illustrates another schematic view of the embodiment of the plurality of column groups.

FIG. 6 illustrates a schematic view of an embodiment of a parity check code storage block.

DETAILED DESCRIPTION OF THE INVENTION

Figure 4:
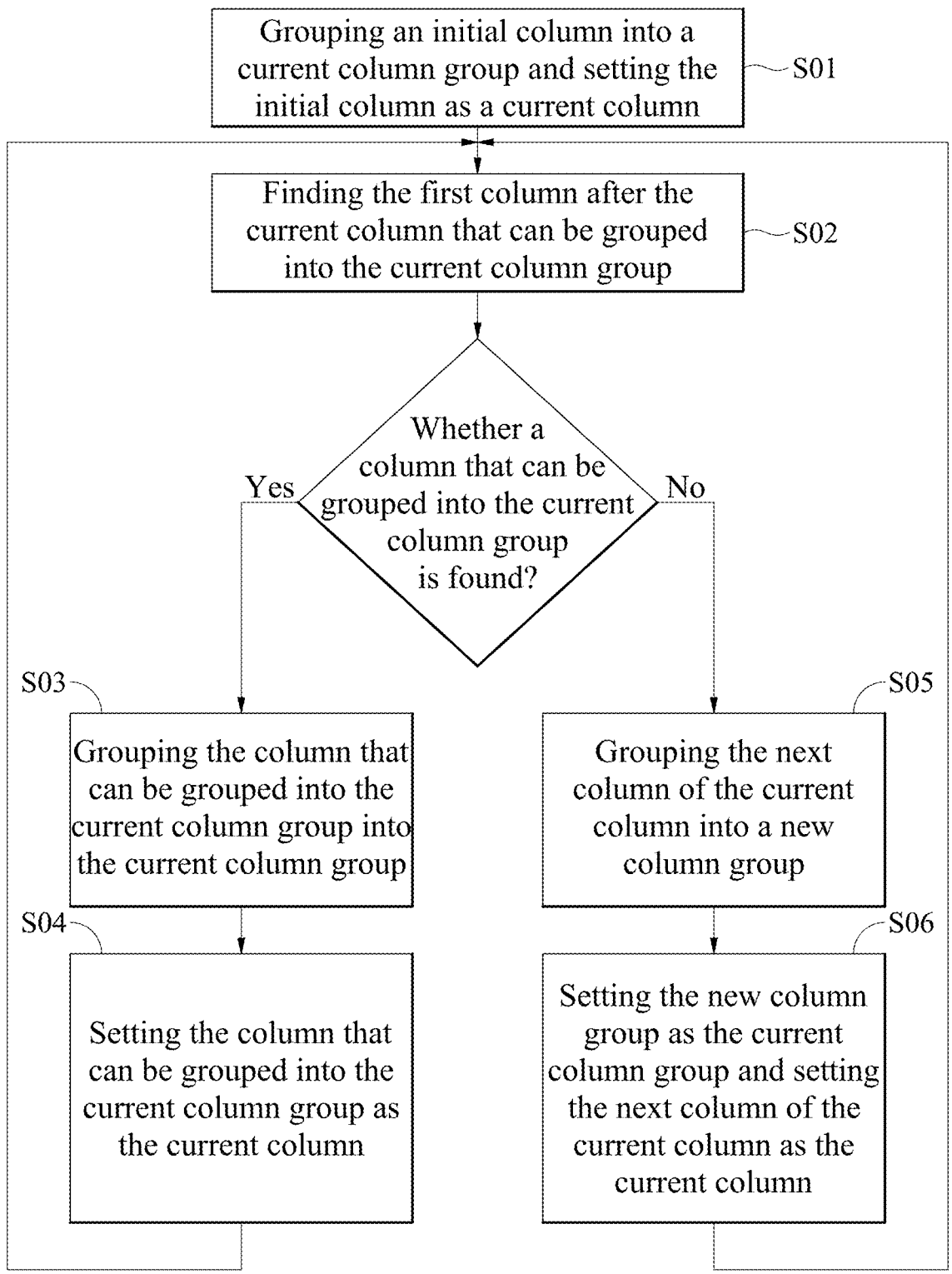
FIG. 4 illustrates a flowchart of an embodiment of a method for grouping a plurality of columns of the parity check code matrix into the column groups.

Please refer to FIG. 1A to FIG. 1C. A parity check code matrix M1 comprises a plurality of columns C, and each of the columns C comprises a plurality of submatrices M2. The parity check code matrix M1 shown in FIG. 1A to FIG. 1C is an LDPC check code adapted to a 25G PON which is a 17664×3072 sparse matrix composed of a 69×12 array of 256×256 submatrices, that is, this parity check code matrix M1 comprises sixty-nine columns C, and each of the columns C comprises twelve 256×256 submatrices M2. Each of the submatrices M2 is a zero matrix or a shifted identity matrix. In FIG. 1A to FIG. 1C, if there is a number in the grid representing the submatrix M2, it indicates that the submatrix M2 is an identity matrix, and the number in the grid represents the shift number of the identity matrix. If there is no number in the grid representing the submatrix M2, it indicates that the submatrix M2 is a zero matrix. For convenience of explanation, the following only takes a 7×7 identity matrix as an example to illustrate the shift number of the identity matrix. The 7×7 identity matrix is as shown in Table 1 below.

TABLE 1

| 1 | 0 | 0 | 0 | 0 | 0 | 0 |
|---|---|---|---|---|---|---|
| 0 | 1 | 0 | 0 | 0 | 0 | 0 |
| 0 | 0 | 1 | 0 | 0 | 0 | 0 |

TABLE 1-continued

| 0 | 0 | 0 | 1 | 0 | 0 | 0 |
|---|---|---|---|---|---|---|
| 0 | 0 | 0 | 0 | 1 | 0 | 0 |
| 0 | 0 | 0 | 0 | 0 | 1 | 0 |
| 0 | 0 | 0 | 0 | 0 | 0 | 1 |

In some embodiments, the shift number of the identity matrix is a rightward shift number. When the shift number is 1 (that is, when the number in the grid representing the submatrix M2 is 1), the shifted identity matrix is as shown in Table 2 below.

TABLE 2

| 0 | 1 | 0 | 0 | 0 | 0 | 0 |
|---|---|---|---|---|---|---|
| 0 | 0 | 1 | 0 | 0 | 0 | 0 |
| 0 | 0 | 0 | 1 | 0 | 0 | 0 |
| 0 | 0 | 0 | 0 | 1 | 0 | 0 |
| 0 | 0 | 0 | 0 | 0 | 1 | 0 |
| 0 | 0 | 0 | 0 | 0 | 0 | 1 |
| 1 | 0 | 0 | 0 | 0 | 0 | 0 |

When the shift number is 2 (that is, when the number in the grid representing the submatrix M2 is 2), the shifted identity matrix is as shown in Table 3 below.

TABLE 3

| 0 | 0 | 1 | 0 | 0 | 0 | 0 |
|---|---|---|---|---|---|---|
| 0 | 0 | 0 | 1 | 0 | 0 | 0 |
| 0 | 0 | 0 | 0 | 1 | 0 | 0 |
| 0 | 0 | 0 | 0 | 0 | 1 | 0 |
| 0 | 0 | 0 | 0 | 0 | 0 | 1 |
| 1 | 0 | 0 | 0 | 0 | 0 | 0 |
| 0 | 1 | 0 | 0 | 0 | 0 | 0 |

As shown in Table 1 to Table 3, when the shift number is 1, all the 1 values in the identity matrix shift to the right by 1 column, and the 1 values in the rightmost column of the identity matrix shift to the leftmost column. When the shift number is 2, all the 1 values in the identity matrix shift to the right by 2 columns, and the 1 values in the two rightmost columns of the identity matrix shift to the two leftmost columns. The examples shown in Table 1 to Table 3 can be analogized to the case where the shift number is a number greater than 2 and the case of a 256×256 identity matrix. In some embodiments, the shift number of the identity matrix is a leftward shift number.

In FIG. 1A to FIG. 1C, for convenience of explanation, the sixty-nine columns C comprised in the parity check code matrix M1 are referred to as columns C0 to C68, and the submatrices M2 comprised in each of the columns C are the twelve submatrices M2 located directly below the column C. Taking the column C0 as an example, the submatrices M2 comprised in column C0 are twelve submatrices M2 located directly below the column C0, from the submatrix M2 with the shift number of 27 to the submatrix M2 with the shift number of 88.

In FIG. 1A to FIG. 1C, the parity check code matrix M1 is an LDPC check code adapted to the 25G PON, but the present disclosure is not limited thereto. In some embodiments, the parity check code matrix M1 may be an LDPC check code adapted to the PON of any rate (such as APON, BPON, EPON, and GPON), Ethernet, or other data communication protocols.

In FIG. 1A to FIG. 1C, the parity check code matrix M1 comprises sixty-nine columns C, and each of the columns C comprises twelve 256×256 submatrices M2, but the present disclosure is not limited thereto. In some embodiments, the parity check code matrix M1 may comprise any number of columns C, each of the columns C may comprise any number of submatrices M2, and the submatrices M2 may be of any size.

Figure 2:
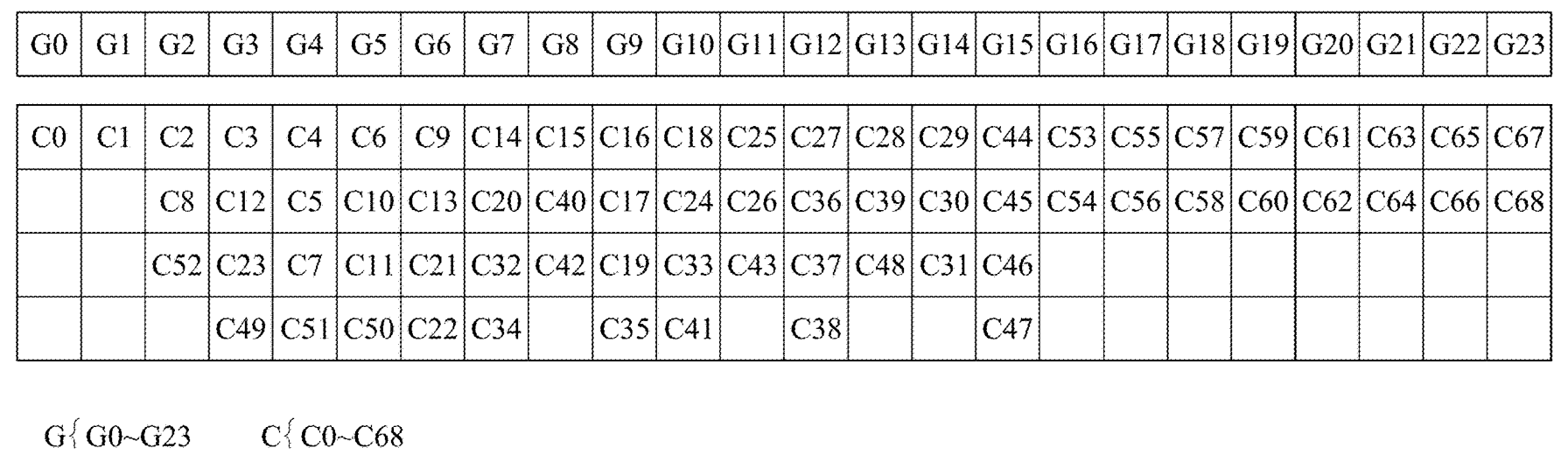

In some embodiments, the columns C comprised in the parity check code matrix M1 are grouped into a plurality of column groups G, and each of the column groups G comprises at least one column C. Please refer to FIG. 2. The columns C0 to C68 comprised in the parity check code matrix M1 shown in FIG. 1A to FIG. 1C are grouped into the column groups G shown in FIG. 2. For convenience of explanation, the column groups G are referred to as column groups G0 to G23, and the at least one column C comprised in each column group G is the at least one column C located directly below the column group G. Taking the column groups G0 to G3 as examples, the at least one column C comprised in the column group G0 is the column C0 located directly below the column group G0, the at least one column C comprised in the column group G1 is the column C1 located directly below the column group G1, the at least one column C comprised in the column group G2 are the column C2, the column C8, and the column C52 located directly below the column group G2, and the at least one column C comprised in the column group G3 are the column C3, the column C12, the column C23, and the column C49 located directly below column group G3. In some embodiments, the number of the columns C comprised in each of the column groups G ranges from 1 to 4, but the present disclosure is not limited thereto. The number of the columns C comprised in each of the column groups G may be any number.

In some embodiments, the grouping requirement for grouping the columns C comprised in the parity check code matrix M1 into the column groups G is that the number of the non-zero matrices in the same row of all columns C in each of the column groups G cannot exceed 1. Please refer to FIG. 1A to FIG. 1C and FIG. 2. Taking the column group G0 to G3 as examples, among the 1st to 12th rows of the column C0, only the 2nd row of the column C0 is a zero matrix, and the remaining rows of the column C0 are all non-zero matrices; however, among the columns C1 to C68, there is no column C with only the 2nd row of a non-zero matrix, so that the column C0 cannot be grouped with any other column C. Therefore, the column group G0 only comprises column C0. Similarly, all rows of the column C1 are all non-zero matrices, so that the column C1 cannot be grouped with any other column C. Therefore, the column group G1 only comprises column C1. The 1st, 5th, and 9th rows of the column C2 are non-zero matrices, and the remaining rows of the column C2 are all zero matrices. The 2nd, 7th, and 12th rows of the column C8 are non-zero matrices, and the remaining rows of the column C2 are all zero matrices. The 3rd, 4th, 6th, 8th, 10th, and 11th rows of the column C52 are non-zero matrices, and the remaining rows of the column C52 are all zero matrices. There is no more than one non-zero matrix in the same row of the column C2, the column C8, and the column C52, so that the column C2, the column C8, and the column C52 can be grouped into the same group. Therefore, the column group G2 comprises the column C2, the column C8, and the column C52. The 7th, 9th, and 10th rows of the column C3 are non-zero matrices, and the remaining rows of the column C3 are all zero matrices. The 2nd, 5th, and 11th rows of the column C12 are non-zero matrices, and the remaining rows of the column C12 are all zero matrices. The 1st, 8th, and 12th rows of the column C23 are non-zero matrices, and the remaining rows of the column C23 are all zero matrices. The 3rd, 4th, and 6th rows of the column C49 are non-zero matrices, and the remaining rows of the column C49 are all zero matrices. There is no more than one non-zero matrix in the same row of the column C3, the column C12, the column C23, and the column C49, so that the column C3, the column C12, the column C23, and the column C49 can be grouped into the same group. Therefore, the column group G3 comprises the column C3, the column C12, the column C23, and the column C49. From the above examples of the column groups G0 to G3, the grouping situation of the column groups G4 to G23 can be analogized.

By grouping the columns C comprised in the parity check code matrix M1 into the column groups G, the zero matrices located in the same row of all columns C in each of the column groups G will be merged, and the number of the submatrices M2 comprised in each of the column groups G (i.e., the number of the rows of the submatrices M2 comprised in each of the column groups G) is the same as the number of the rows of the submatrices M2 comprised in the column C. For example, please refer to FIG. 3. Since both the column group G0 and the column group G1 only comprise one column C, the column group G0 and the column group G1 do not have zero matrices located in the same column will be merged. Since the column group G, comprises the column C2, the column C8 and the column C52, the zero matrices located in the same row of the column C2, the column C8 and the column C52 will be merged. Since the column group G3 comprises the column C3, the column C12, the column C23 and the column C49, the zero matrices located in the same row of the column C3, the column C12, the column C23 and the column C49 will be merged. The number of the submatrices M2 comprised in the column group G0, the column group G1, the column group G2 and the column group G3 is the number of the rows of the submatrices M2 comprised in the column C, which is 12. From the above examples of the column groups G0 to G3, the situation of the column groups G4 to G23 can be analogized.

Please refer to FIG. 4. In some embodiments, a method for grouping the columns C comprised in the parity check code matrix M1 into the column groups G comprises the following steps in sequence: grouping an initial column C into a current column group G and setting the initial column C as a current column C (step S01); finding the first column C after the current column C that can be grouped into the current column group G (step S02); when a column C that can be grouped into the current column group G is found, grouping the column C that can be grouped into the current column group G into the current column group G (step S03); setting the column C that can be grouped into the current column group G as the current column C (step S04) and then executing the step S02 again; when no column C that can be grouped into the current column group G can be found, grouping the next column C of the current column C into a new column group G (step S05) and the current column group G is regarded as a full group; and setting the new column group G as the current column group G and setting the next column C of the current column C as the current column C (step S06) and then executing the step S02 again.

Please refer to FIG. 1A to FIG. 1C and FIG. 4. The method shown in FIG. 4 is exemplified by grouping the columns C comprised in the parity check code matrix M1 shown in FIG. 1A to FIG. 1C into the column groups G. First, the column C0 (i.e., the initial column C) is grouped into the column group G0 (i.e., the current column group G) and the column C0 is set as the current column C (step S01). Then, find the first column C after the column C0 that can be grouped into the column group G0 (step S02). When no column C that can be grouped into the column group G0 is found, the column group G0 is regarded as a full group, and the column C1 (i.e., the next column C of the column C0) is grouped into the column group G1 (i.e., the new column group G) (step S05) and the column group G1 is set as the current column group G and the column C1 is set as the current column C (step S06). Then, find the first column C after the column C1 that can be grouped into the column group G1 (step S02). When no column C that can be grouped into the column group G1 is found, the column group G1 is regarded as a full group, and the column C2 (i.e., the next column C of the column C1) is grouped into the column group G2 (i.e., the new column group G) (step S05) and the column group G2 is set as the current column group G and the column C2 is set as the current column C (step S06). Then, find the first column C after the column C2 that can be grouped into the column group G2 (step S02). When the column C6 that can be grouped into the column group G2 is found, the column C6 is grouped into the column group G2 (step S03) and the column C6 is set as the current column C (step S04). Then, find the first column C after the column C6 that can be grouped into the column group G2 (step S02). When the column C8 that can be grouped into the column group G2 is found, the column C8 is grouped into the column group G2 (step S03) and the column C8 is set as the current column C (step S04). Then, find the first column C after the column C8 that can be grouped into the column group G2 (step S02). When the column C49 that can be grouped into the column group G2 is found, the column C49 is grouped into the column group G2 (step S03) and the column C49 is set as the current column C (step S04). Then, find the first column C after the column C49 that can be grouped into the column group G2 (step S02).

When using the method illustrated in FIG. 4 to group the columns C comprised in the parity check code matrix M1 shown in FIG. 1A to FIG. 1C into the column groups G, the column C0 and the column C1 will be grouped independently, the column C2, the column C6, the column C8, and the column C49 will be grouped into the same column group G, the column C3, the column C4, and the column C5 will be grouped into the same column group G, and so on. The grouping results for the remaining columns C will not be described in detail here. In the above example, the column C0 is set as the initial column C, but the present disclosure is not limited thereto. In some embodiments, any column C comprised in the parity check code matrix M1 may be set as the initial column C.

Figure 5:
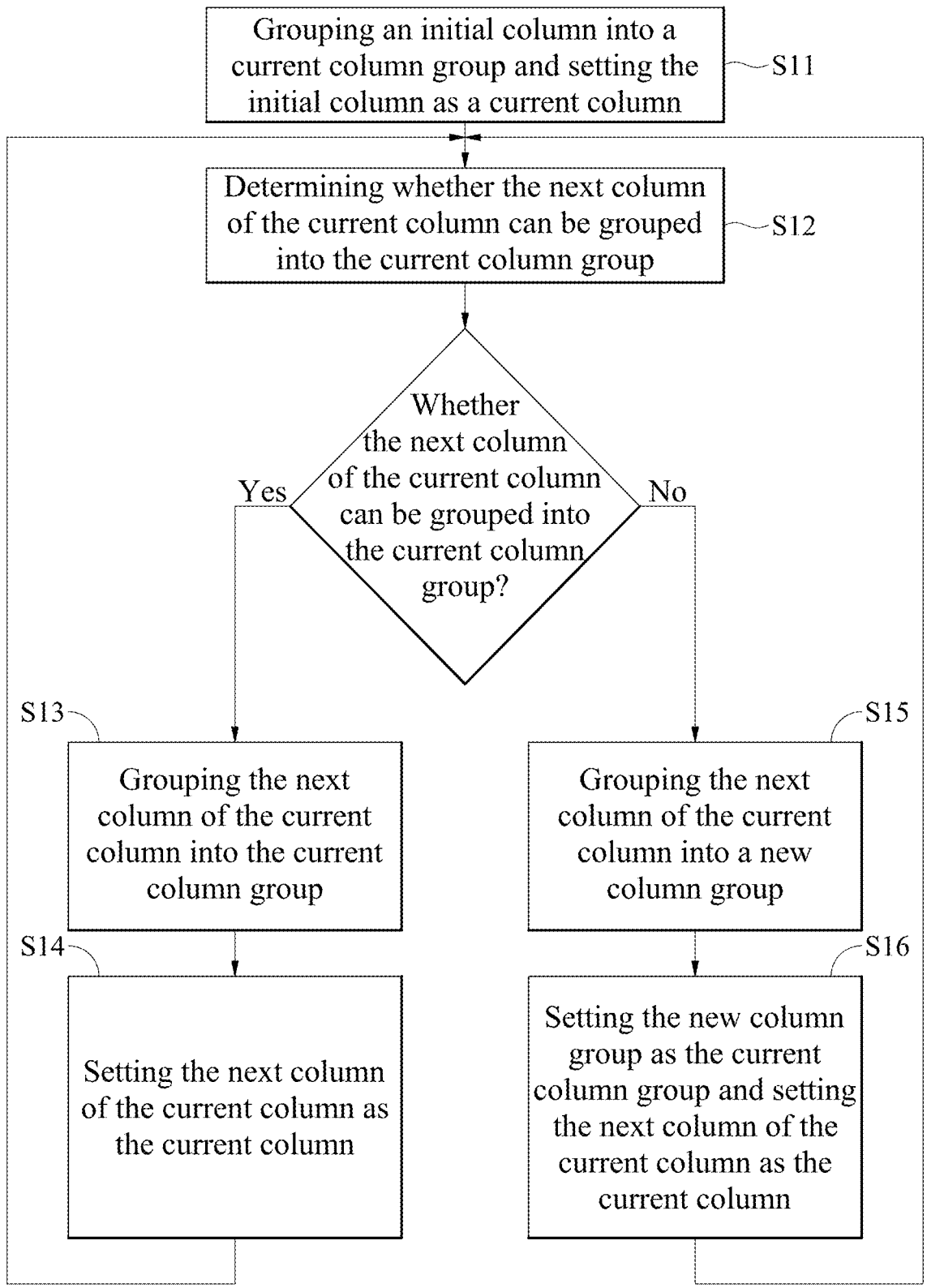
FIG. 5 illustrates a flowchart of another embodiment of the method for grouping the columns of the parity check code matrix into the column groups.

Please refer to FIG. 5. In some embodiments, the method for grouping the columns C comprised in the parity check code matrix M1 into the column groups G comprises the following steps in sequence: grouping an initial column C into a current column group G and setting the initial column C as a current column C (step S11); determining whether the next column C of the current column C can be grouped into the current column group G (step S12); when the next column C of the current column C can be grouped into the current column group G, grouping the next column C of the current column C into the current column group G (step S13); setting the next column C of the current column C as the current column C (step S14) and then executing the step S02 again; when the next column C of the current column C cannot be grouped into the current column group G, grouping the next column C of the current column C into a new column group G (step S15) and the current column group G is regarded as a full group; setting the new column group G as the current column group G and setting the next column C of the current column C as the current column C (step S16) and then executing the step S02 again.

Please refer to FIG. 1A to FIG. 1C and FIG. 5. The method shown in FIG. 5 is exemplified by grouping the columns C comprised in the parity check code matrix M1 shown in FIG. 1A to FIG. 1C into the column groups G. First, the column C0 (i.e., the initial column C) is grouped into the column group G0 (i.e., the current column group G) and the column C0 is set as the current column C (step S11). Then, determine whether the column C1 (i.e., the next column C of the column C0) can be grouped into the column group G0 (step S12). When the column C1 cannot be grouped into the column group G0, the column group G0 is regarded as a full group, and the column C1 (i.e., the next column C of the column C0) is grouped into the column group G1 (i.e., the new column group G) (step S15) and the column group G1 is set as the current column group G and the column C1 is set as the current column C (step S16). Then, determine whether the column C2 (i.e., the next column C of the column C1) can be grouped into the column group G1 (step S12). When the column C2 cannot be grouped into the column group G1, the column group G1 is regarded as a full group, and the column C2 (i.e., the next column C of the column C1) is grouped into the column group G2 (i.e., the new column group G) (step S15) and the column group G2 is set as the current column group G and the column C2 is set as the current column C (step S16). Then, determine whether the column C3 (i.e., the next column C of the column C2) can be grouped into the column group G2 (step S12). When the column C3 cannot be grouped into the column group G2, the column group G2 is regarded as a full group, and the column C3 (i.e., the next column C of the column C2) is grouped into the column group G3 (i.e., the new column group G) (step S15) and the column group G3 is set as the current column group G and the column C3 is set as the current column C (step S16). Then, determine whether the column C4 (i.e., the next column C of the column C3) can be grouped into the column group G3 (step S12). When the column C4 can be grouped into the column group G3, the column C4 is grouped into the column group G3 (step S13) and the column C4 is set as the current column C (step S14). Then, determine whether the column C5 (i.e., the next column C of the column C4) can be grouped into the column group G3 (step S12). When the column C5 can be grouped into the column group G3, the column C5 is grouped into the column group G3 (step S13) and the column C5 is set as the current column C (step S14). Then, determine whether the column C6 (i.e., the next column C of the column C5) can be grouped into the column group G3 (step S12).

When using the method illustrated in FIG. 5 to group the columns C comprised in the parity check code matrix M1 shown in FIG. 1A to FIG. 1C into the column groups G, the column C0, the column C1, and the column C2 will be grouped independently, the column C3, the column C4, and the column C5 will be grouped into the same column group G, the column C6 will be grouped independently, the column C7 and the column C8 will be grouped into the same column group G, the column C9 will be grouped independently, and so on. The grouping results for the remaining columns C will not be described in detail here. In the above example, the column C0 is set as the initial column C, but the present disclosure is not limited thereto. In some embodiments, any column C comprised in the parity check code matrix M1 may be set as the initial column C.

In some embodiments, the columns C comprised in the parity check code matrix M1 may be grouped into the column groups G through a trial and error method. In some embodiments, a computer program is configured to execute a trial and error method to group the columns C comprised in the parity check code matrix M1 into the column groups G, and the column groups G shown in FIG. 2 is the result of grouping through the trial and error method. In the embodiment of FIG. 2, the number of the column groups G is 24, but the present disclosure is not limited thereto. In some embodiments, the number of the column groups G may be any number. Since each of the columns C is assigned to only one column group G, the parity check code matrix M1 is able to be partitioned into tile layout groups without multiplexing between the partitions.

Please refer to FIG. 6. A parity check code storage block B1 comprises a plurality of column group storage blocks B2. The parity check code storage block B1 is configured to store the parity check code matrix M1. Each of the column group storage blocks B2 is configured to store one of the column groups G. The column groups G stored in the column group storage blocks B2 of FIG. 6 correspond to the column groups G of FIG. 2. The column group storage block B2 which stores the column group G comprising more of the columns C is disposed closer to the center of the parity check code storage block B1. Taking the parity check code storage block B1 shown in FIG. 6 as an example, the number of the columns C comprised in each of the column groups G ranges from 1 to 4. The column group storage blocks B2 which store the column group G comprising 4 columns C (G15, G10, G12, G7, G9, G5, G6, G3, and G4) are disposed in the central region of the parity check code storage block B1. The column group storage blocks B2 which store the column group G comprising 3 columns C (G2, G8, G11, G13, and G14) are disposed relatively further from the center of the parity check code storage block B1 compared to the column group storage blocks B2 which store the column group G comprising 4 columns C. The column group storage blocks B2 which store the column group G comprising 2 columns C (G16, G17, G18, G19, G20, G21, G22, and G23) are disposed even further from the center of the parity check code storage block B1 compared to the column group storage blocks B2 which store the column group G comprising 3 columns C. The column group storage blocks B2 which store the column group G comprising only 1 column C (G0 and G1) are disposed at the edges of the parity check code storage block B1.

Figure 7:
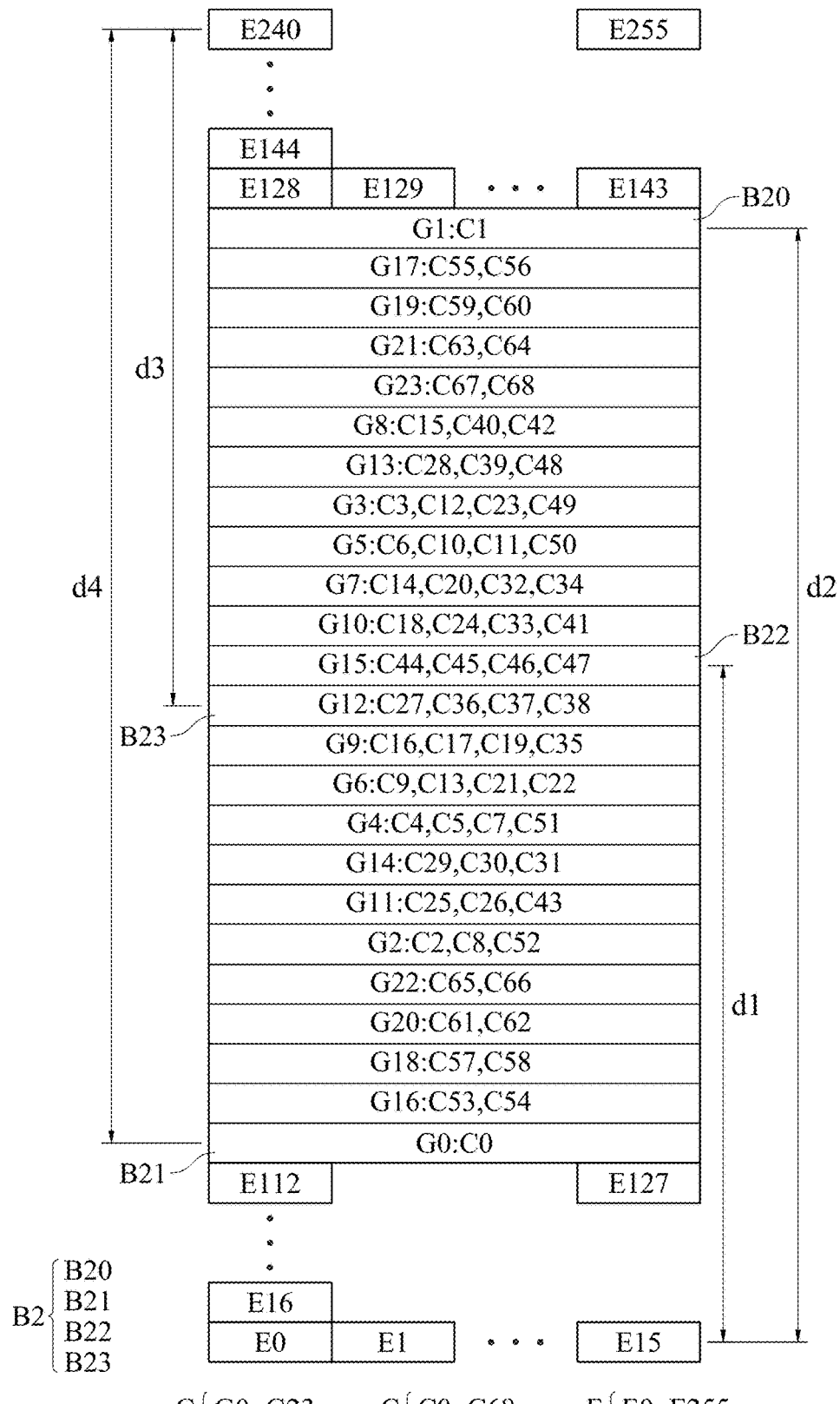
FIG. 7 illustrates a schematic view of an embodiment of an LDPC decoder.

Please refer to FIG. 7. The low-density parity check (LDPC) decoder 1 comprises the parity check code storage block B1 and a plurality of computing engines E. In some embodiments, the computing engines E are disposed in a checkerboard arrangement on the two sides of the parity check code storage block B1. In the LDPC decoder 1 shown in FIG. 7, the number of the computing engines E is 256, but the present disclosure is not limited thereto. The number of the computing engines E may be any number. In some embodiments, the number of the computing engines E disposed on one of the two sides of the parity check code storage block B1 and the number of the computing engines E disposed on the other side of the parity check code storage block B1 are the same. Taking the LDPC decoder 1 in FIG. 7 as an example, when the number of the computing engines E is 256, the number of the computing engines E disposed on the one side of the parity check code storage block B1 and the number of the computing engines E disposed on the other side of the parity check code storage block B1 are both 128, but the present disclosure is not limited thereto. The number of the computing engines E disposed on the one side of the parity check code storage block B1 and the number of the computing engines E disposed on the other side of the parity check code storage block B1 may be different. In some embodiments, when the number of the computing engines E disposed on the one side of the parity check code storage block B1 and the number of the computing engines E disposed on the other side of the parity check code storage block B1 are both 128, the computing engines E are disposed in a 16×8 checkerboard arrangement on the two sides of the parity check code storage block B1, but the present disclosure is not limited thereto. The computing engines E may be disposed in a checkerboard arrangement of any size on the two sides of the parity check code storage block B1. In some embodiments, the LDPC decoder 1 is a 25G PON decoder, but the present disclosure is not limited thereto. In some embodiments, the LDPC decoder 1 may be a decoder adapted to the PON of any rate (such as APON, BPON, EPON, and GPON), Ethernet, or other data communication protocols. In some embodiments, the computing engines E are symmetrically disposed on the two sides of the parity check code storage block B1.

By grouping the columns C comprised in the parity check code matrix M1 into the column groups G, the zero matrices located in the same row of all columns C in each of the column groups G will be merged. Therefore, the computing engines E do not need to perform computations on the merged zero matrices, thereby enhancing the computing speed of the computing engines E and reducing the number of required signals of the computing engines E. The computer-aided design (CAD) tools for placement and routing can successfully place and route the LDPC decoder 1 in FIG. 7. The CAD tool will not encounter the problem of being unable to place and route the LDPC decoder 1 due to the use of too many computing engines E. Because the LDPC decoder 1 can use 256 computing engines E to perform computations on the parity check code matrix M1 stored in the parity check code storage block B1 for decoding and error correction, the required clock speed of the LDPC decoder 1 can be greatly reduced, leading to a substantial decrease in power consumption.

In the LDPC decoder 1 of FIG. 7, for convenience of explanation, the computing engines E are referred to as computing engines E0 to E255. A distance d2 between the column group storage block B2 which stores the column group G1 (hereinafter referred to as the column group storage block B20) and the computing engine E15 is the farthest vertical distance from the column group storage block B20 to the computing engines E. A distance d1 between the column group storage block B2 which stores the column group G15 (hereinafter referred to as the column group storage block B22) and the computing engine E15 is the farthest vertical distance from the column group storage block B22 to the computing engines E. A distance d4 between the column group storage block B2 which stores the column group G0 (hereinafter referred to as the column group storage block B21) and the computing engine E240 is the farthest vertical distance from the column group storage block B21 to the computing engines E. A distance d3 between the column group storage block B2 which stores the column group G12 (hereinafter referred to as the column group storage block B23) and the computing engine E240 is the farthest vertical distance from the column group storage block B23 to the computing engines E. In some embodiments, the distance d2 and the distance d4 are equal in length, and the distance d1 and the distance d3 are equal in length, but the present disclosure is not limited thereto.

In some embodiments, the computing engines E perform computations on the parity check code matrix M1 stored in the parity check code storage block B1 by using the log-likelihood ratio (LLR) minimum-sum algorithm to decode and correct the parity check code matrix M1. In some embodiments, the log-likelihood ratio represents accuracy through precision bits. In some embodiments, each of the column group storage block B2 comprises 6 precision bits, but the present disclosure is not limited thereto. Each of the column group storage block B2 may comprise any number of the precision bits. In some embodiments, the 6 precision bits comprise 1 sign bit and 5 value bits. In some embodiments, the number of the precision bits is determined through extensive experiments on a large field programmable gate array (FPGA) test platform. In some embodiments, each of the computing engines E comprises 288 signals (24 (the number of the column group storage blocks B2)*6 (the number of the precision bits)*2 (input and output)=288).

Figure 8A:
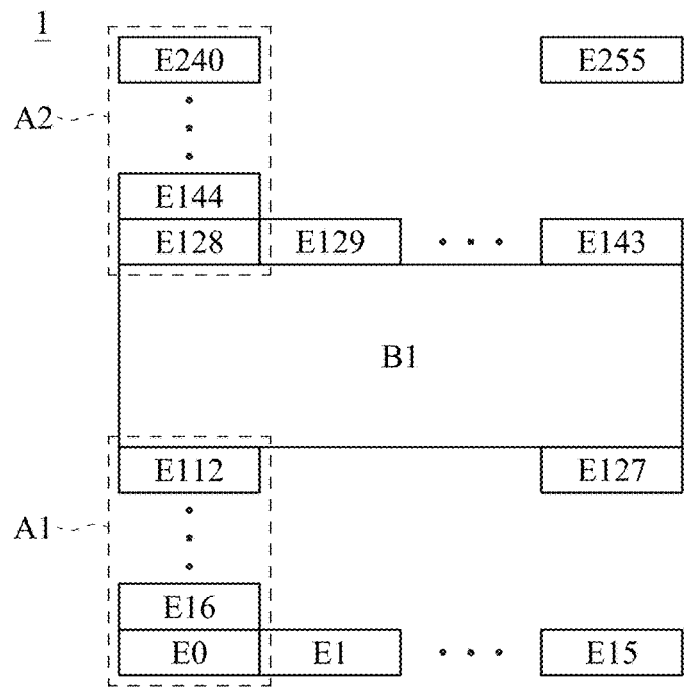
FIG. 8A illustrates another schematic view of the embodiment of the LDPC decoder.
Figure 8B:
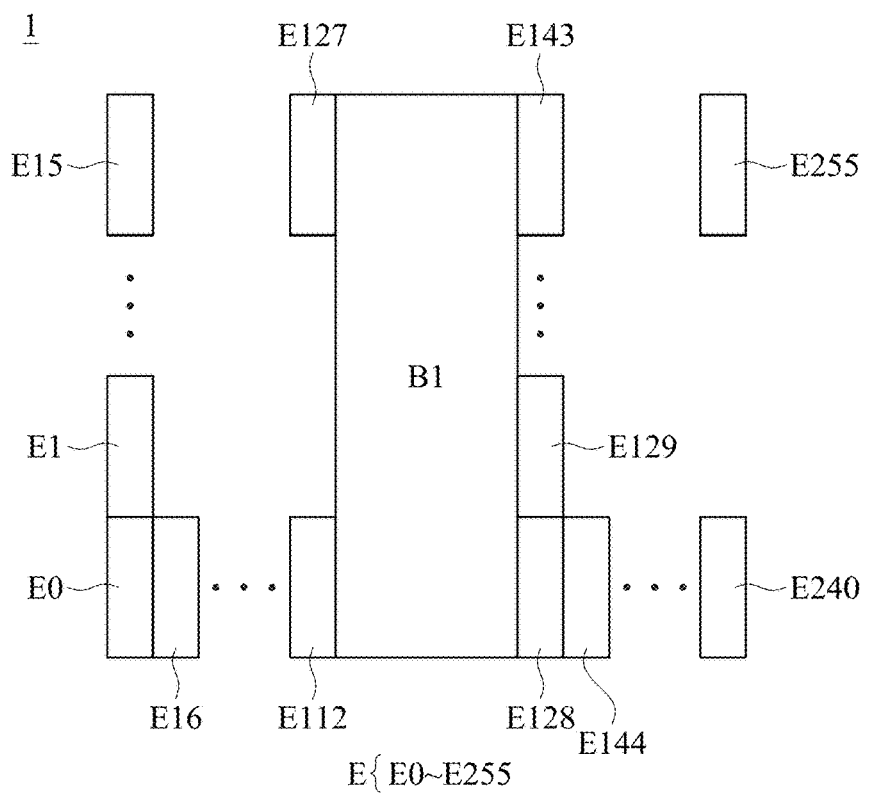
FIG. 8B illustrates a schematic view of another embodiment of the LDPC decoder.

Please refer to FIG. 8A and FIG. 8B. In some embodiments, the computing engines E are disposed in a checkerboard arrangement on the upper side and the lower side of the parity check code storage block B1 (as shown in FIG. 8A). In some embodiments, the computing engines E are disposed in a checkerboard arrangement on the left side and the right side of the parity check code storage block B1 (as shown in FIG. 8B). In some embodiments, the layout of the LDPC decoder 1 shown in FIG. 8B is the layout rotated 90 degrees from the layout of the LDPC decoder 1 shown in FIG. 8A. In some embodiments, if the number of available horizontal routing wires is greater than the number of available vertical routing wires in the IC fabrication process, the layout of the LDPC decoder 1 shown in FIG. 8B may be more suitable than the layout of the LDPC decoder 1 shown in FIG. 8A.

Figure 9A:
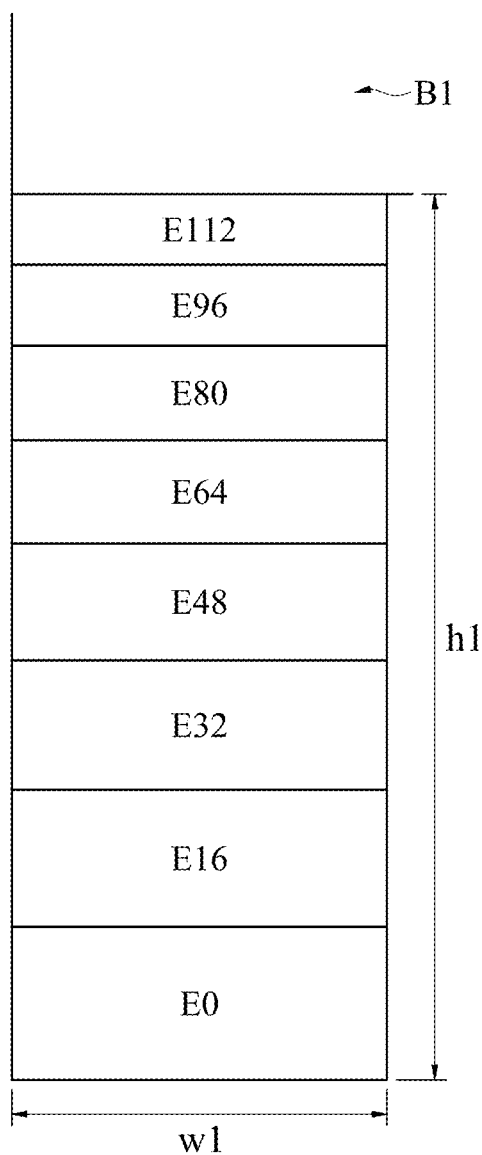
FIG. 9A illustrates an enlarged view of an embodiment of a plurality of computing engines in area A1 of FIG. 8A.
Figure 9B:
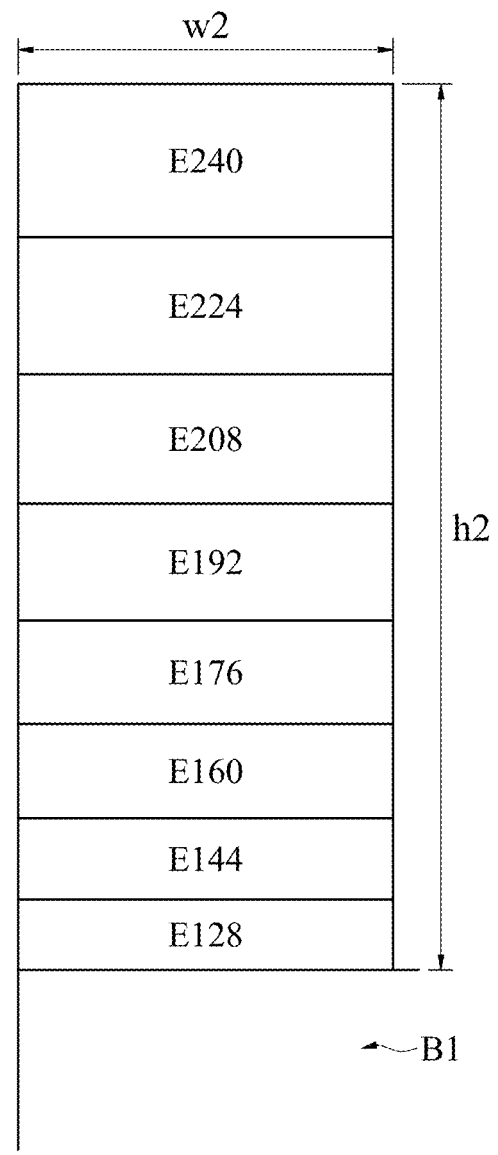
FIG. 9B illustrates an enlarged view of an embodiment of the computing engines in area A2 of FIG. 8A.

Please refer to FIG. 9A and FIG. 9B. In some embodiments, the computing engines E in the same column among the computing engines E arranged in a checkerboard arrangement on of the two sides of the parity check code storage block B1 comprise a plurality of wires. Taking the 8 computing engines E in the same column at the lower side of the parity check code storage block B1 as shown in FIG. 9A and the 8 computing engines E in the same column at the upper side of the parity check code storage block B1 as shown in FIG. 9B as examples, when the number of the column group storage blocks B2 is 24 and each of the column group storage block B2 comprises 6 precision bits, the number of wires comprised in the 8 computing engines E shown in FIG. 9A and the 8 computing engines E shown in FIG. 9B are both 2304 (8 (the number of the computing engines E)*24 (the number of the column group storage blocks B2)*6 (the number of the precision bits)*2 (input and output)=2304). When the LDPC decoder 1 is manufactured by using the 12-nanometer (nm) process of Taiwan Semiconductor Manufacturing Company (TSMC), the width w1 of the 8 computing engines E shown in FIG. 9A and the width w2 of the 8 computing engines E shown in FIG. 9B are both 92.16 (um) (2304 (the number of wires)*0.08 micrometers (um) (the width of the wire)/2 (the number of wire layers)=92.16 (um)). The width of the wire and the number of wire layers are determined by TSMC's 12 nm process. In some embodiments, the width of the wire and the number of wire layers are determined by the process used by the LDPC decoder 1.

In some embodiments, the computing engine E which is further away from the parity check code storage block B1 has a larger circuit area and a faster computing speed. Taking FIG. 9A as an example, the computing engine E96 has a larger circuit area and a faster computing speed as compared with the computing engine E112. The computing engine E80 has a larger circuit area and a faster computing speed as compared with the computing engine E96, and so on. The computing engine E0 has the largest circuit area and the fastest computing speed among the computing engines E shown in FIG. 9A. Similarly, the computing engine E240 has the largest circuit area and the fastest computing speed among the computing engines E shown in FIG. 9B. In some embodiments, the circuit area of the computing engine E with the largest circuit area among the computing engines E disposed in the same column (i.e., the computing engine E0 in FIG. 9A or the computing engine E240 in FIG. 9B) may be, but is not limited to 3000 square micrometers (squm). Taking FIG. 9A as an example, assuming that the width w1 of the 8 computing engines E is 92.16 um and the circuit area of the computing engine E0 is 3000 squm, the height of the computing engine E0 is 32.55 (um) (3000 (squm)/91.6 (um)=32.55 (um)). In some embodiments, the circuit area of the computing engine E with the smallest circuit area among the computing engines E disposed in the same column (i.e., the computing engine E112 in FIG. 9A or the computing engine E128 in FIG. 9B) may be, but is not limited to 2000 square nanometers (squm). Taking FIG. 9A as an example, assuming that the width w1 of the 8 computing engines E is 92.16 um and the circuit area of the computing engine E112 is 3000 squm, the height of the computing engine E112 is 21.7 (um) (2000 (squm)/91.6 (um)=21.7 (um)).

Due to the considerable distance from the parity check code storage block B1 to the farthest computing engine E (i.e., the total height h1 of the 8 computing engines E in FIG. 9A and the total height h2 of the 8 computing engines E in FIG. 9B) (Taking the total height h1 and the total height h2 as examples, the distance from the parity check code storage block B1 to the farthest computing engine E is approximately 217 (um) (21.7 (um)+32.55 (um)/2*8=217 (um))). Therefore, in some embodiments, it may be necessary to dispose buffer zones between some of two adjacent computing engines E of the computing engines E to segment the computing engines E in the same column so as to enhance the strength of signals from the parity check code storage block B1, thereby preventing the signals from the parity check code storage block B1 from taking too long to propagate to some of the computing engines E.

Figure 10:
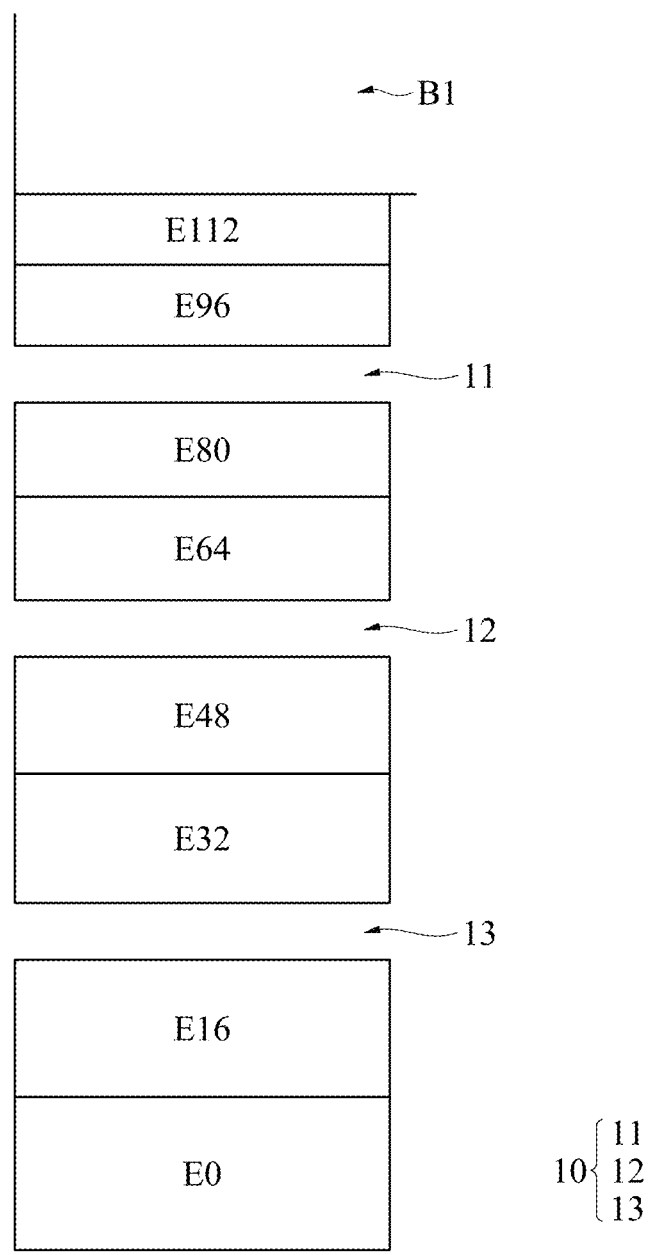
FIG. 10 illustrates an enlarged view of another embodiment of the computing engines in area A1 of FIG. 8A.

Please refer to FIG. 10. In some embodiments, a buffer zone 10 is disposed between some of two adjacent computing engines E in the same column, and a plurality of buffer zones 10 are disposed among the computing engines E in the same column. For convenience of explanation, the buffer zones 10 shown in FIG. 10 are respectively referred to as buffer zone 11, buffer zone 12, and buffer zone 13. The signal from the parity check code storage block B1 have to be propagated to the computing engine E112, the computing engines E96, the computing engines E80, the computing engines E64, the computing engines E48, the computing engines E32, the computing engines E16, and the computing engines E0. The signal passing through the buffer zone 11 has to be propagated to the computing engine E80, the computing engine E64, the computing engine E48, the computing engine E32, the computing engine E16, and the computing engine E0. The signal passing through the buffer zone 12 has to be propagated to the computing engine E48, the computing engine E32, the computing engine E16, and the computing engine E0. The signal passing through the buffer zone 13 just has to be propagated to the computing engine E16 and the computing engine E0. Therefore, the buffering capacity of the buffer zone 11 (i.e., the signal strength enhancement capability) has to be greater than the buffering capacity of the buffer zone 12 and the buffer zone 13, and the buffering capacity of the buffer zone 12 also has to be greater than the buffering capacity of the buffer zone 13. In some embodiments, the buffer zone 10 comprises one or more buffer units. The greater the number of the buffer units comprised in the buffer zone 10, the stronger the buffering capacity. Therefore, the number of the buffer units comprised in the buffer zone 11 is greater than the number of the buffer units comprised in the buffer zone 12 and the buffer zone 13, and the number of the buffer units comprised in the buffer zone 12 is also greater than the number of the buffer units comprised in the buffer zone 13. The greater the number of the buffer units comprised in the buffer zone 10, the larger its circuit area. Therefore, the circuit area of the buffer zone 11 is larger than the circuit area of the buffer zone 12 and the buffer zone 13, and the circuit area of the buffer zone 12 is also larger than the circuit area of the buffer zone 13. In some embodiments, the placement locations of the buffer zones 10 and the number of the buffer units comprised in each of the buffer zones 10 are determined based on the resistance (R) value, inductance (L) value, and capacitance (C) value of the wire. In some embodiments, the buffer unit may be, but is not limited to, a buffer gate. In some embodiments, the computing engines E and the buffer units are symmetrically disposed on the two sides of the parity check code storage block B1.

To sum up, in some embodiments, the LDPC decoder 1 can use 256 computing engines E to perform computations on the parity check code matrix M1 stored in the parity check code storage block B1 for decoding and error correction. Therefore, the required clock speed of the LDPC decoder 1 can be greatly reduced, leading to a substantial decrease in power consumption.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A low-density parity check (LDPC) decoder, comprising:
a parity check code storage block configured to store a parity check code matrix, wherein the parity check code matrix comprises a plurality of columns, each of the columns comprises a plurality of submatrices, the parity check code storage block comprises a plurality of column group storage blocks, each of the column group storage blocks is configured to store a column group comprising at least one of the columns, and the column group storage block which stores the column group comprising more of the columns is disposed closer to the center of the parity check code storage block; and
a plurality of computing engines, coupled to the parity check code storage block, wherein the computing engines are configured to perform LLR minimum sum computations on the parity check code matrix, and the computing engines are disposed on two sides of the parity check code storage block.

2. The LDPC decoder according to claim 1, wherein the computing engines are disposed in a checkerboard arrangement on the two sides of the parity check code storage block.

3. The LDPC decoder according to claim 1, wherein the computing engine which is further away from the parity check code storage block has a faster computing speed.

4. The LDPC decoder according to claim 1, wherein a buffer zone is disposed between some of two adjacent computing engines of the computing engines, and the buffer zone comprises one or more buffer units.

5. The LDPC decoder according to claim 4, wherein the buffer zone which is further away from the parity check code storage block comprises more of the buffer units and has a greater buffering capacity.

6. The LDPC decoder according to claim 2, wherein the number of the computing engines disposed on one of the two sides of the parity check code storage block and the number of the computing engines disposed on the other side of the parity check code storage block are the same.

7. The LDPC decoder according to claim 5, wherein the LDPC decoder is a 25G passive optical network (PON) decoder.

8. The LDPC decoder according to claim 7, wherein the number of the computing engines is 256, and the number of the computing engines disposed on the one side of the parity check code storage block and the number of the computing engines disposed on the other side of the parity check code storage block are both 128.

9. The LDPC decoder according to claim 8, wherein the computing engines are disposed in a 16×8 checkerboard arrangement on the two sides of the parity check code storage block.

10. The LDPC decoder according to claim 1, wherein each of the column group storage blocks comprises 6 precision bits.

11. The LDPC decoder according to claim 10, wherein the 6 precision bits comprise 1 sign bit and 5 value bits.

12. The LDPC decoder according to claim 1, wherein the number of the column group storage blocks is 24.

13. The LDPC decoder according to claim 1, wherein the number of the columns comprised in each of the column groups ranges from 1 to 4.

14. The LDPC decoder according to claim 1, wherein each of the columns is assigned to only one of the column group.

15. The LDPC decoder according to claim 1, wherein each of the columns comprises a plurality of rows, each of the submatrices is located in a corresponding one of the rows, each of the submatrices is a zero matrix or a shifted identity matrix, and the zero matrices located in the same row of all of the columns in each of the column groups are merged.

16. The LDPC decoder according to claim 1, wherein the computing engines are symmetrically disposed on the two sides of the parity check code storage block.

* * * * *